(12) United States Patent
Chou et al.

(10) Patent No.: US 10,439,066 B2
(45) Date of Patent: Oct. 8, 2019

(54) SEMICONDUCTOR STRUCTURE AND MANUFACTURING METHOD THEREOF

(71) Applicant: United Microelectronics Corp., Hsinchu (TW)

(72) Inventors: Ling-Chun Chou, Tainan (TW); Kun-Hsien Lee, Tainan (TW)

(73) Assignee: United Miccroelectronics Corp., Hsinchu (TW)

( * ) Notice: Subject to any disclaimer, the term of this patent is extended or adjusted under 35 U.S.C. 154(b) by 0 days.

(21) Appl. No.: 15/721,177

(22) Filed: Sep. 29, 2017

(65) Prior Publication Data

US 2019/0067480 A1    Feb. 28, 2019

(30) Foreign Application Priority Data

Aug. 30, 2017   (CN) .......................... 2017 1 0761591

(51) Int. Cl.
| | |
|---|---|
| *H01L 29/78* | (2006.01) |
| *H01L 27/088* | (2006.01) |
| *H01L 29/165* | (2006.01) |
| *H01L 29/66* | (2006.01) |
| *H01L 21/8234* | (2006.01) |
| *H01L 27/06* | (2006.01) |

(52) U.S. Cl.
CPC .. *H01L 29/7848* (2013.01); *H01L 21/823412* (2013.01); *H01L 21/823418* (2013.01); *H01L 21/823456* (2013.01); *H01L 27/0605* (2013.01); *H01L 27/088* (2013.01); *H01L 29/165* (2013.01); *H01L 29/66636* (2013.01); *H01L 21/823481* (2013.01)

(58) Field of Classification Search
CPC .......... H01L 29/6653; H01L 29/66636; H01L 29/7845; H01L 21/266; H01L 21/308; H01L 21/3081; H01L 21/3083; H01L 21/3086; H01L 21/31; H01L 21/31051; H01L 21/31053; H01L 21/823814; H01L 21/823418; H01L 21/823468; H01L 21/823864

See application file for complete search history.

(56) References Cited

U.S. PATENT DOCUMENTS

| | | | |
|---|---|---|---|
| 8,039,902 B2 | 10/2011 | Kim et al. | |
| 2012/0025266 A1* | 2/2012 | Griebenow | ....... H01L 21/28518 257/190 |
| 2015/0179654 A1* | 6/2015 | Mehrotra | ............ H01L 27/1104 257/77 |
| 2016/0189970 A1* | 6/2016 | Huang | ................ H01L 21/3081 438/703 |

\* cited by examiner

*Primary Examiner* — David C Spalla
(74) *Attorney, Agent, or Firm* — J.C. Patents

(57) ABSTRACT

A semiconductor structure is provided. The semiconductor structure includes a substrate, a plurality of first gate structures, a plurality of second gate structures, a first strained region, and a second strained region. The substrate has a first region and a second region. The first gate structures are disposed in the first region on the substrate. The second gate structures are disposed in the second region on the substrate. The first strained region is formed in the substrate and has a first distance from an adjacent first gate structure. The second strained region is formed in the substrate and has a second distance from an adjacent second gate structure, wherein the second distance is greater than the first distance.

13 Claims, 7 Drawing Sheets

SEMICONDUCTOR STRUCTURE AND MANUFACTURING METHOD THEREOF

CROSS-REFERENCE TO RELATED APPLICATION

This application claims the priority benefit of China application serial no. 201710761591.8, filed on Aug. 30, 2017. The entirety of the above-mentioned patent application is hereby incorporated by reference herein and made a part of this specification.

BACKGROUND OF THE INVENTION

Field of the Invention

The invention relates to a semiconductor structure manufacturing technique, and more particularly, to a transistor structure in a core circuit and an input/output (IO) circuit.

Description of Related Art

An electronic circuit generally contains a core circuit and an IO circuit. The core circuit and the IO circuit respectively contain a desired metal oxide semiconductor (MOS) transistor. The transistor of the core circuit corresponds to the operating speed of the core circuit, and a faster operating speed is demanded in design. The transistor of an IO circuit is connected to an external circuit and needs to match the external circuit, and therefore in terms of design, the predetermined operating speed of the transistor thereof is slower than the operating speed of the core circuit.

The transistors of the core circuit and the IO circuit contain the same or similar processes or structures in manufacture, and therefore the two transistors are manufactured at the same time. In these similar structures, the gate structures and the strained regions used as the source/drain (S/D) regions in the substrate are, for instance, manufactured in the same step at the same time for transistors with the same conductivity type.

In actuality, based on the size and the target response speed of the transistors respectively for the core circuit and the IO circuit, different design goals are made in consideration for performance matching. In manufacture, the core circuit and the IO circuit are not separately manufactured, and therefore in the same manufacture, the desired target values respectively for the core circuit and the IO circuit are relatively hard to achieve.

In particular, the distance between the source/drain regions and the gates affects the response speed of the transistor. If it is based on the manufacturing conditions of the transistor of the core circuit, then the performance of the transistor of the IO circuit deviates from the design target value, such as the response speed of the transistor is too fast, such that the operation of the overall integrated circuit is flawed in matching.

How to maintain transistor requirements of an IO circuit while manufacturing the transistors of the core circuit and the IO circuit at the same time is a concern of design and manufacture.

SUMMARY OF THE INVENTION

The invention relates to a semiconductor structure and a manufacturing method thereof that can adjust the distance from the S/D regions to the gates for different requirements of the transistors of the core circuit and the IO circuit such that the manufacture of the transistors of the core circuit and the IO circuit can meet design requirements.

According to an embodiment of the invention, a semiconductor structure includes a substrate, a plurality of first gate structures, a plurality of second gate structures, a first strained region, and a second strained region. The substrate has a first region and a second region. The first gate structures are disposed in the first region on the substrate. The second gate structures are disposed in the second region on the substrate. The first strained region is formed in the substrate and has a first distance from an adjacent first gate structure. The second strained region is formed in the substrate and has a second distance from an adjacent second gate structure, wherein the second distance is greater than the first distance.

In a semiconductor structure according to an embodiment of the invention, the first strained region and the second strained region both contain a recess in the substrate, and an epitaxial layer is in the recess.

In a semiconductor structure according to an embodiment of the invention, the material of the epitaxial layer is SiGe.

In a semiconductor structure according to an embodiment of the invention, the second distance is at least 1.5 times the first distance.

In a semiconductor structure according to an embodiment of the invention, the thickness of the spacers of a first sidewall of the plurality of first gate structures is the same as the thickness of the spacers of a second sidewall of the plurality of second gate structures.

In a semiconductor structure according to an embodiment of the invention, the first strained region and the second strained region are used to form source/drain regions with respect to the plurality of first gate structures and the plurality of second gate structures.

In a semiconductor structure according to an embodiment of the invention, the first region is a core device region and the second region is an I/O device region.

According to an embodiment of the invention, a semiconductor device manufacturing method is provided, wherein a substrate has a first region and a second region. The semiconductor device manufacturing method includes forming a plurality of first gate structures in the first region on the substrate and a plurality of second gate structures in the second region on the substrate. A mask layer is formed on the plurality of first gate structures and the plurality of second gate structures, wherein the mask layer is entirely higher than the plurality of first gate structures and the plurality of second gate structures. The mask layer is planarized to obtain a flat surface; forming an etch mask layer on the flat surface of the mask layer. The etch mask layer has a plurality of first mask regions covering the plurality of first gate structures and extended by a first distance and a plurality of second mask regions covering the plurality of second gate structures and extended by a second distance. The second distance is substantially greater than the first distance. An etching process is performed according to the etch mask layer to expose a plurality of surface regions of the substrate. A plurality of strained regions is formed in the plurality of surface regions in the substrate. The mask layer is the removed.

In a semiconductor device manufacturing method according to an embodiment of the invention, the step of forming the plurality of strained regions includes etching the substrate in the plurality of surface regions to form a plurality of recesses in the substrate, removing the etch mask layer, and forming an epitaxial layer in the plurality of recesses.

In a semiconductor device manufacturing method according to an embodiment of the invention, the material of the epitaxial layer is SiGe.

In a semiconductor device manufacturing method according to an embodiment of the invention, the second distance is at least 1.5 times the first distance.

In a semiconductor device manufacturing method according to an embodiment of the invention, the first strained region and the second strained region are used to form source/drain regions with respect to the plurality of first gate structures and the plurality of second gate structures.

In a semiconductor device manufacturing method according to an embodiment of the invention, the first region is a core device region and the second region is an I/O device region.

In a semiconductor device manufacturing method according to an embodiment of the invention, the thickness of the mask layer is enough to completely fill the space between an adjacent pair in the plurality of first gate structures and the plurality of second gate structures.

According to an embodiment of the invention, a semiconductor device manufacturing method is provided, wherein a substrate has a first region and a second region. The semiconductor device manufacturing method includes forming a plurality of first gate structures in the first region on the substrate and a plurality of second gate structures in the second region on the substrate. A mask layer is formed on the plurality of first gate structures and the plurality of second gate structures, wherein the mask layer is kept conformal to the plurality of first gate structures and the plurality of second gate structures. An etch mask layer is formed on the mask layer to cover the plurality of second gate structures and extended by a distance, wherein the etch mask layer does not cover the plurality of first gate structures. An etching process is performed, using the etch mask layer to expose a plurality of surface regions of the substrate. A plurality of strained regions is formed in the plurality of surface regions in the substrate. The mask layer is removed.

In a semiconductor device manufacturing method according to an embodiment of the invention, the step of forming the plurality of strained regions includes etching the substrate in the plurality of surface regions to form a plurality of recesses in the substrate, removing the etch mask layer, and forming an epitaxial layer in the plurality of recesses.

In a semiconductor device manufacturing method according to an embodiment of the invention, the material of the epitaxial layer is SiGe.

In a semiconductor device manufacturing method according to an embodiment of the invention, a second distance from the strained regions to an adjacent second gate structure is at least 1.5 times a first distance from the strained regions to an adjacent first gate structure.

In a semiconductor device manufacturing method according to an embodiment of the invention, the plurality of strained regions is used to form source/drain regions with respect to the plurality of first gate structures and the plurality of second gate structures.

In a semiconductor device manufacturing method according to an embodiment of the invention, the first region is a core device region and the second region is an I/O device region.

In a semiconductor device manufacturing method according to an embodiment of the invention, the thickness of the mask layer is within a range and conformal to the plurality of first gate structures and the plurality of second gate structures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
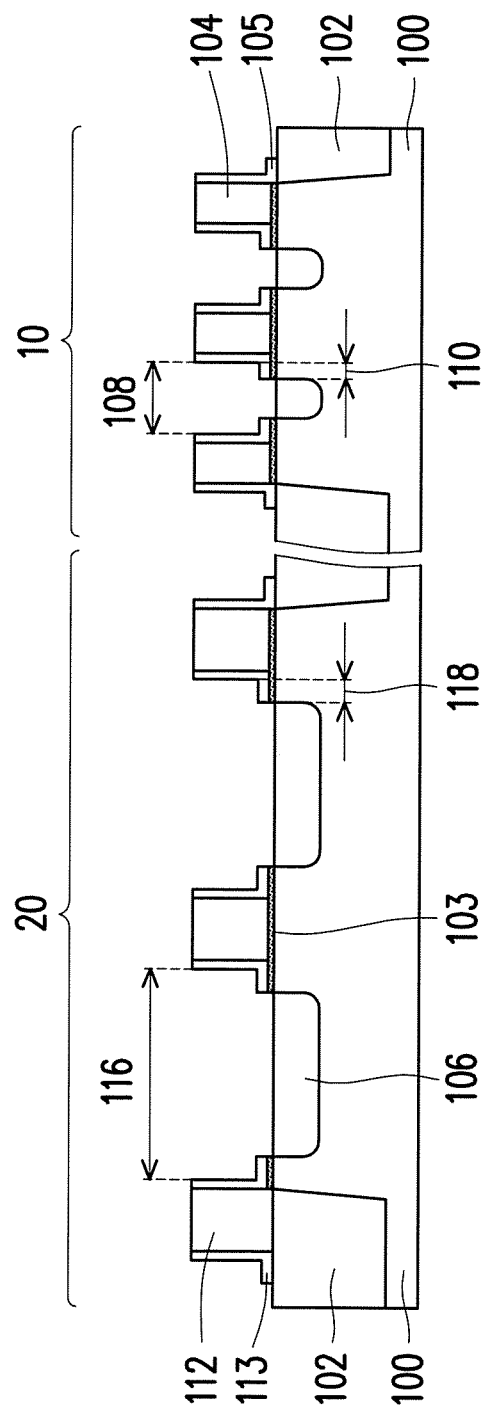
FIG. 1 is a schematic of a semiconductor structure according to the invention.

Hereinafter, exemplary embodiments of the invention are described in detail, and examples of the exemplary embodiment are conveyed via the figures. Wherever possible, the same reference numerals are used in the drawings and the descriptions to refer to the same or similar portions.

A complete integrated circuit generally contains a core circuit and an IO circuit distributed on the same wafer and manufactured at the same time. The transistor of the core circuit corresponds to the operating speed of the core circuit, and a faster operating speed is demanded in design. The transistor of an IO circuit is connected to an external circuit and needs to match the external circuit, and therefore in terms of design, the predetermined operating speed of the transistor thereof is slower than the operating speed of the core circuit.

One of the factors for adjusting the operating speed of the transistor is the distance between the source/drain regions and the gates. In other words, for the transistor of the core circuit, the distance from the source/drain regions thereof to the gates can be designed to be less than the distance from the source/drain regions of the transistor of the IO circuit to the gates. Therefore, the transistor of the IO circuit can meet design requirements.

However, in semiconductor manufacture, the transistors of the core circuit and the IO circuit are manufactured by the same method, and the distance from the source/drain regions to the gates is the same. As a result, the operating speed of the transistor of the IO circuit is significantly higher than the design, such that abnormal operation occurs.

The traditional method has not provided an effective method to adjust the distance from the source/drain regions to the gates.

FIG. 1 is a schematic of a semiconductor structure according to the invention. Referring to FIG. 1, in the invention, potential issues are looked into. Hereinafter, the transistors of the semiconductor structure in the core circuit and the IO circuit are described.

A first region 10 and a second region 20 are planned on the substrate 100 and are separated by, for instance, isolation structures 102. The first region 10 and the second region 20 are, for instance, manufactured in response to the core circuit and the IO circuit. A plurality of gate structures 104 is in the first region 10. A plurality of gate structures 112 is in the second region 20. Here, the number of the gate structures shown in FIG. 1 is only exemplary.

A gate insulating layer 103 is between the gate structures 104 and 112 and the substrate, such as a gate oxide layer. Spacers 105 and 113 are provided to the sidewalls of the gate structures 104 and 112. The gate structures 104 and 112 can be known gate structures and can also be a stacked structure which is elaborated in the embodiments below.

The transistor of the IO circuit corresponds to, for instance, the demand of circuit matching, wherein the size thereof is greater and response speed is slower, and therefore a distance 116 between a pair of gate structures 112 is greater. Strained regions 106 are formed in the substrate 100 between the gate structures 112 and are, for instance, SiGe epitaxial layers as the source/drain regions. Similarly, the transistor of the core circuit of the first region 10 is smaller, and therefore the width of the gate structures 104 is smaller and a distance 108 between the gate structures 104 is smaller.

However, since the spacers 113 of the gate structures are formed in the same process, a first distance 110 between the strained regions 106 of the core circuit of the first region 10 and the gate structures 104 is substantially the same as a second distance 118 between the strained regions 106 of the IO circuit of the second region 20 and the gate structures 112.

Similar to the structure of FIG. 1, the first distance 110 and the second distance 118 are substantially the same, such that the response speed of the transistor of the IO circuit of the second region 20 is much faster than the predetermined target, and therefore deviation from the design target occurs.

Figure 2:
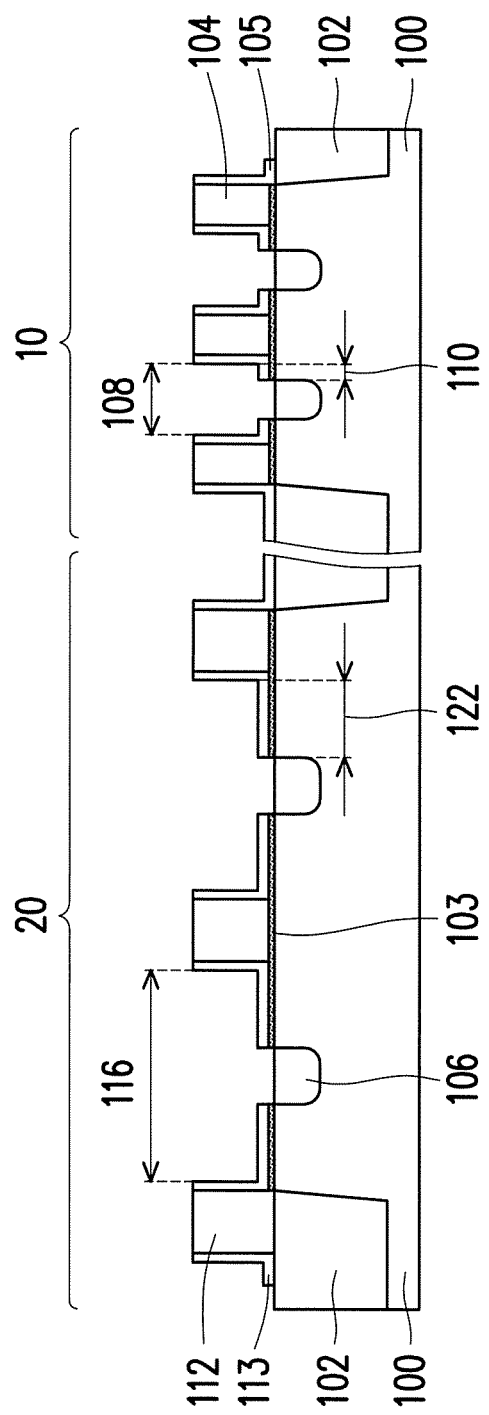
FIG. 2 is a schematic of a semiconductor structure according to an embodiment of the invention.

FIG. 2 is a schematic of a semiconductor structure according to an embodiment of the invention. Referring to FIG. 2, a structure of the IO circuit of the second region 20 more in line with the design objective can be shrunk in the strained regions 106 of the second region 20 and is extended greater at the bottom of the spacers 113 of the gate structures 112. As a result, the second distance 122 between the strained regions 106 of the IO circuit of the second region 20 and the gate structures 112 is greater than the first distance 110 between the strained regions 106 of the core circuit of the first region 10 and the gate structures 104.

In an embodiment, the second distance 122 is at least 1.5 times the first distance 110.

Relatively speaking, the distance 116 is, for instance, 1180 Å, and the distance 108 is, for instance, 720 Å. An effective first distance 110 is 80 Å, and an effective second distance 122 is 150 Å. However, the invention is not limited to the sizes listed.

Some embodiments are provided below to describe how to easily manufacture the semiconductor structure of FIG. 2, wherein the second distance 122 of the transistor of the IO circuit of the second region 20 can better meet design goals. Moreover, it is known that the conductivity type of the transistors can be P type or N type. The transistors of the embodiments provided in the invention are not limited to P type or N type, but P type transistors of two regions are manufactured together, and N type transistors are also manufactured together.

Figure 3A:
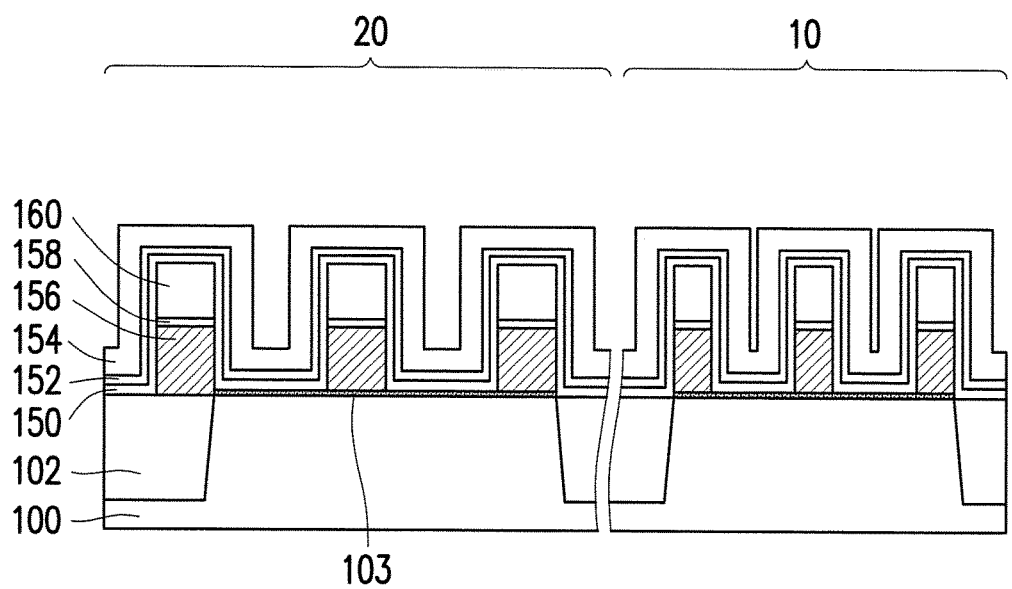
FIGS. 3A to 3E are schematics of the manufacturing process of a semiconductor structure according to an embodiment of the invention.

FIGS. 3A to 3E are schematics of the manufacturing process of a semiconductor structure according to an embodiment of the invention. Please refer to FIG. 3. Referring to FIG. 3A, as described above, a first region 10 and a second region 20 are planned on the substrate 100 and are separated by isolation structures 102. The number of the gate structure is not limited, and is generally a large number. A gate insulating layer 103 is on the substrate 100 and is obtained by, for instance, the oxidation of the substrate 100. Therefore, since the portions of the gate insulating layer 103 on the isolation structures 102 are combined, a reference numeral is not provided.

On the gate insulating layer 103, a gate layer 156 is respectively formed in the first region 10 and the second region 20. The width of the gate layer 156 of the first region 10 is smaller than the width of the gate layer 156 of the second region 20. Based on actual need, the gate layer 156 is stacked with the insulating layers of some dielectric materials, including a dielectric layer 158 and a hard dielectric layer 160 that are integrated into the gate structures 104 and 112 of FIGS. 1 and 2.

Moreover, based on overall design needs, a sealing layer 150 and a hard mask layer 152 conformal to the gate structures are further formed, and the material thereof is, for instance, SiOCN and the thicknesses thereof are, for instance, 27 Å and 70 Å, but the invention is not limited thereto.

In the invention, the effect as shown in FIG. 2 is increased by controlling the thickness of the spacers of the gate structures to obtain the second distance 122 in the second region 20. In the present embodiment, a hard mask layer 154 is further formed to maintain the conformal thickness with the gate structures to cover the gate structures of the first region 20 and the second region 20. The thickness of the mask layer 154 is relatively greater but does not need to completely fill the space between the gate structures, and can be, for instance, less than 250 Å but greater than the sealing layer 150 and the hard mask layer 152. The material of the mask layer 154 is, for instance, SiN which is different from SiOCN, but is not limited thereto.

Figure 3B:
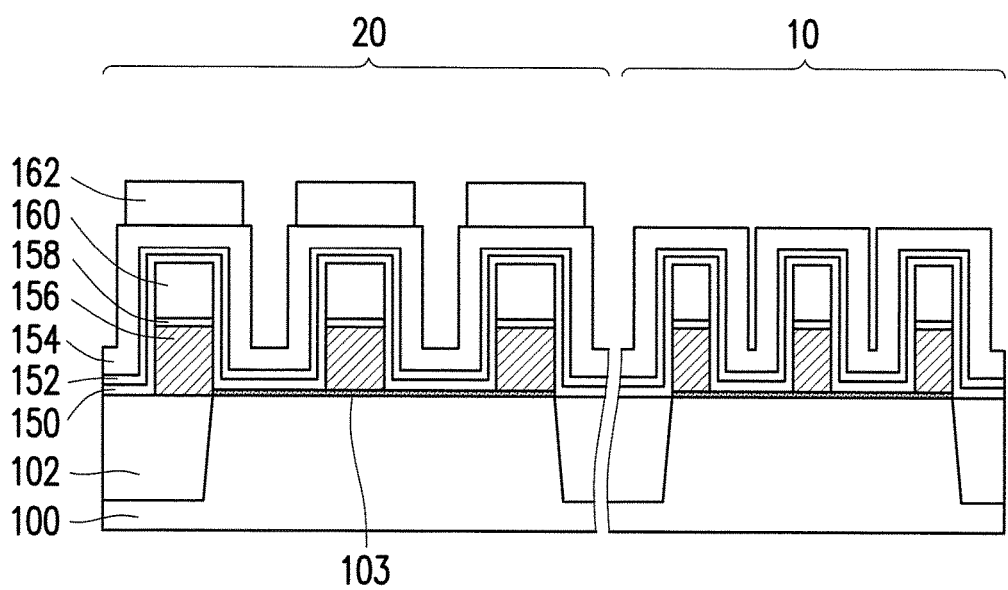

Referring to FIG. 3B, an etch mask layer 162 is formed on the gate structures covering the plurality of second gate layers 156 and extended by a distance, and the distance is used for increasing the spacer thickness in a subsequent process. In the present embodiment, the etch mask layer 162 does not cover the mask layer 154 of the first region 10.

Figure 3C:
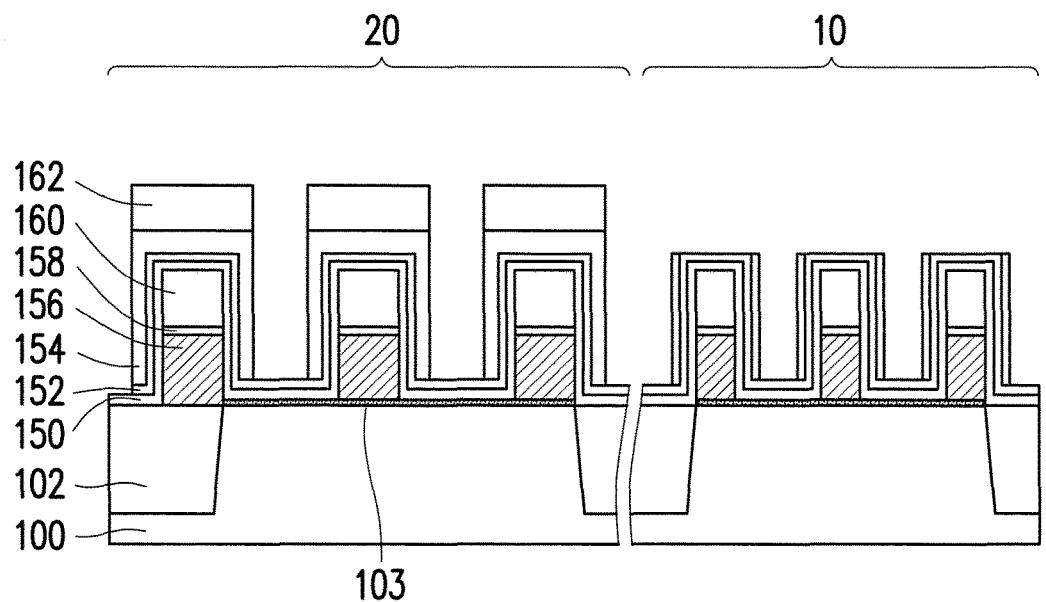

Referring to FIG. 3C, etching is performed using the etch mask layer 162 as a mask, such as anisotropic dry etching. Since the material of the mask layer 154 is, for instance, SiN which is different from SiOCN of the mask layer 152, an etchant having a suitable etch selectivity is selected such that the mask layer 154 can be etched into a smaller thickness substantially until SiOCN. However, the invention is not limited to the above methods.

Figure 3D:
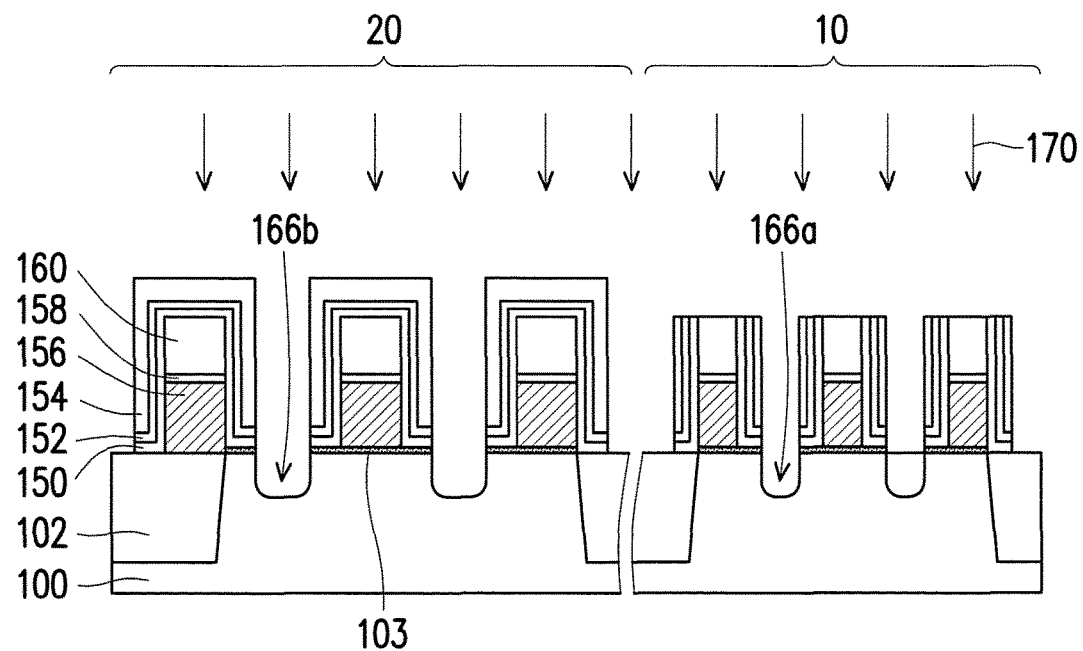

Referring to FIG. 3D, the mask layer 162 is etched and a suitable etchant is used, lastly a greater thickness of the spacer of the gate structures of the second region 20 is decided by the width of the etch mask layer 162, and the thickness of the spacers of the gate structures of the first region 10 is relatively smaller. When the etching step is continued, the surface between the gate layers 156 on the substrate 100 is exposed. At this point, changing the etchant can form recesses 166a and 166b on the substrate 100. Moreover, if needed, an implantation step 170 can also be performed on the recessed substrate 100. The implantation step 170 is performed based on actual need, and is not a necessary step. Before the subsequent strained regions are formed, the etch mask layer 162 is, for instance, a photoresist layer and is removed.

Figure 3E:
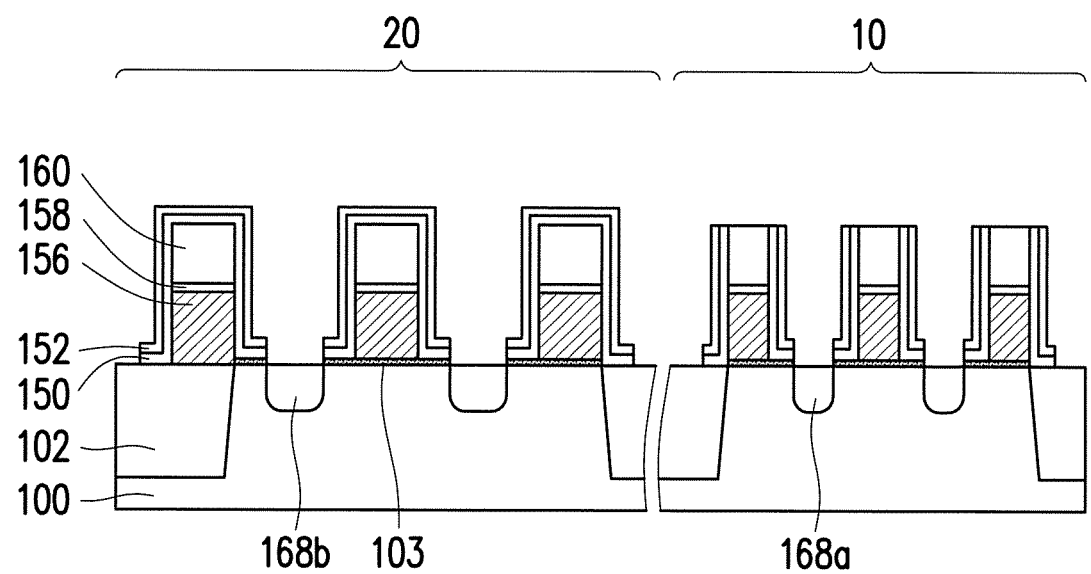

Referring to FIG. 3E, epitaxial layers 168a and 168b are formed in the recesses 166a and 166b as strained regions. The epitaxial layers 168a and 168b are, for instance, SiGe. The epitaxial layers 168a and 168b are used as the source/drain regions. Lastly, the mask layer 154 is also removed. In the present embodiment, the sealing layer 150 and the hard mask layer 152 are kept as spacers of the gate structures, but the invention is not limited thereto. In other words, the sealing layer 150 and the hard mask layer 152 can also be partially or completely removed.

In the manufacturing process above, by controlling the width of the etch mask layer 162, the spacers of the gate structures in the first region 10 can keep a small thickness such that the distance between the epitaxial layer 168a and the gate layers 156 is kept small to meet the demands for the core circuit. Moreover, the spacers of the gate structures in the second region 20 can keep a large thickness such that the distance between the epitaxial layer 168b and the gate layers 156 is kept large to meet the demands for the IO circuit.

Under the same technical concept, the invention further provides another manufacturing process. FIGS. 4A to 4D are schematics of the manufacturing process of a semiconductor structure according to an embodiment of the invention.

Figure 4A:
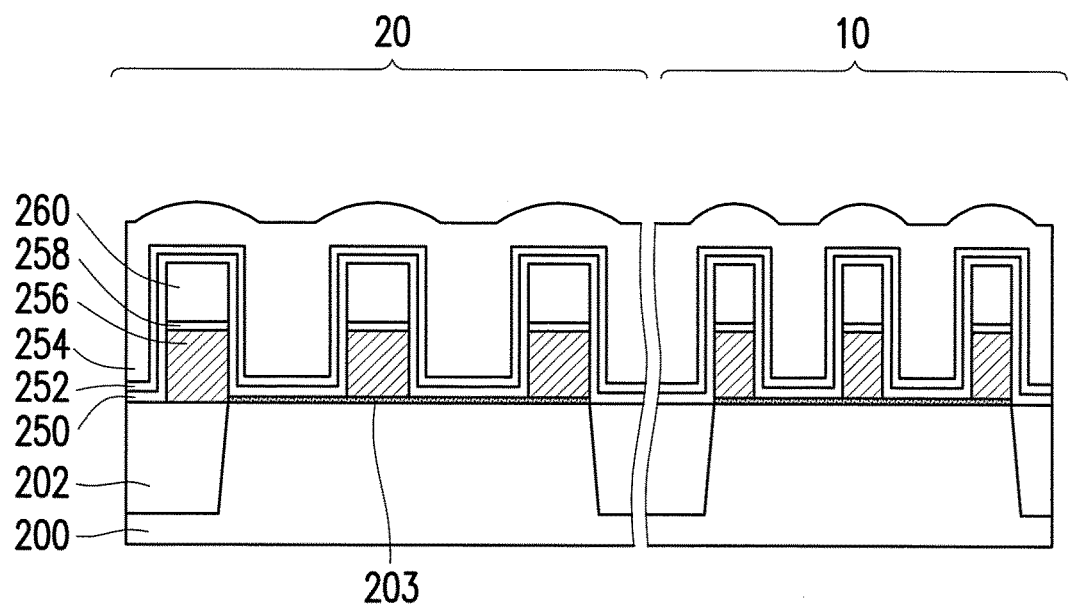
FIGS. 4A to 4D are schematics of the manufacturing process of a semiconductor structure according to an embodiment of the invention.

Referring to FIG. 4A, a first region 10 and a second region 20 are planned on the substrate 200 and are separated by isolation structures 202. The number of the gate structures is not limited, and is generally a large number. A gate insulating layer 203 is on the substrate 200 and is obtained by, for instance, the oxidation of the substrate 200. Therefore, since the portions of the gate insulating layer 203 on the isolation structures 202 are combined, a reference numeral is not provided.

On the gate insulating layer 203, a gate layer 256 is respectively formed in the first region 10 and the second region 20. The width of the gate layer 256 of the first region 10 is smaller than the width of the gate layer 256 of the second region 20. Based on actual need, the gate layer 256 is stacked with the insulating layers of some dielectric materials, including a dielectric layer 258 and a hard dielectric layer 260 that are integrated into the gate structures 104 and 112 of FIGS. 1 and 2.

Moreover, based on overall design needs, a sealing layer 250 and a hard mask layer 252 conformal to the gate structures are further formed, and the material thereof is, for instance, SiOCN and the thicknesses thereof are, for instance, 27 Å and 70 Å, but the invention is not limited thereto.

In an embodiment of the invention, the effect as shown in FIG. 2 is increased by controlling the thickness of the spacers of the gate structures to obtain the second distance 122 in the second region 20. In the present embodiment, a hard mask layer 254 is further formed to cover the gate structures of the first region 10 and the second region 20. The difference of the present embodiment and FIG. 3A includes a greater thickness of the mask layer 254, such as greater than 500 Å which is enough to completely fill the space between the gate structures. The material of the mask layer 254 is, for instance, SiN which is different from SiOCN, but is not limited thereto.

Figure 4B:
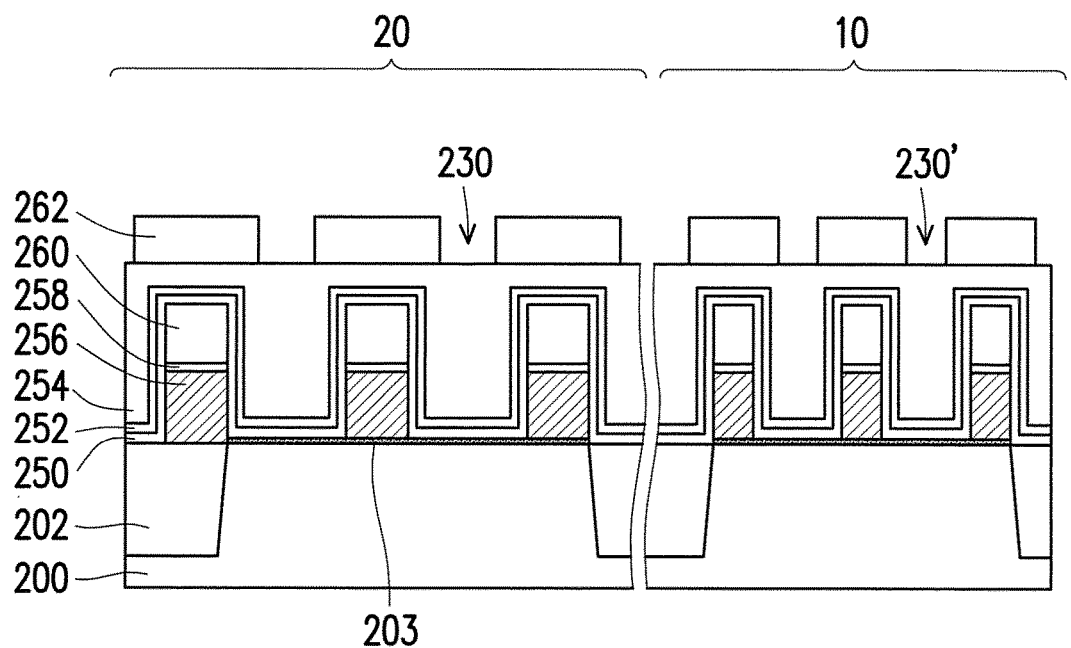

Next, referring to FIG. 4B, planarization is performed on the mask layer 254 first, such as performing polishing to obtain a flat surface. The flat surface facilitates the forming of the etch mask layer 262. The etch mask layer 262 is, for instance, a photoresist layer, and patterns having different sizes are respectively obtained in the first region 10 and the second region 20 via a lithography process. The devices in the first region 10 belong to a core circuit, the width of the gate layer 256 thereof is smaller, and the first distance 110 in FIG. 2 is also designed to be shorter. The devices in the second region 20 belong to an IO circuit, the width of the gate layer 256 thereof is greater, and the second distance 110 in FIG. 2 is also designed to be longer.

In the present embodiment, the difference between the first distance 110 and the second distance 122 is controlled by etching using the mask layer 262. The etch mask layer 262 of the first region 10 is patterned into a plurality of mask regions respectively covering the gate structures containing the gate layer 256 and extended by a distance. An opening 230' between two adjacent mask regions is planned in a subsequent substrate 200, such as the location in which a strained layer 268a is to be formed as shown in FIG. 4D.

Similarly, the etch mask layer 262 of the second region 20 is patterned into a plurality of mask regions covering the gate structures containing the gate layer 256 and extended by a greater distance. An opening 230 between two adjacent mask regions is subsequently planned in the substrate 200, such as the location in which a strained layer 268b is to be formed as shown in FIG. 4D.

Figure 4C:
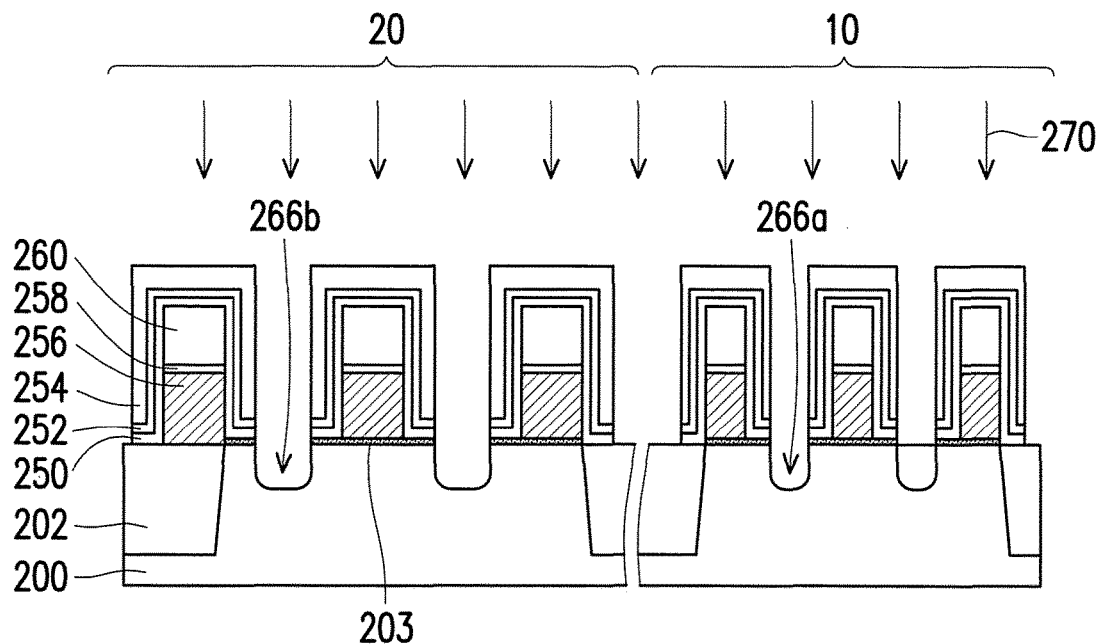
Figure 4D:
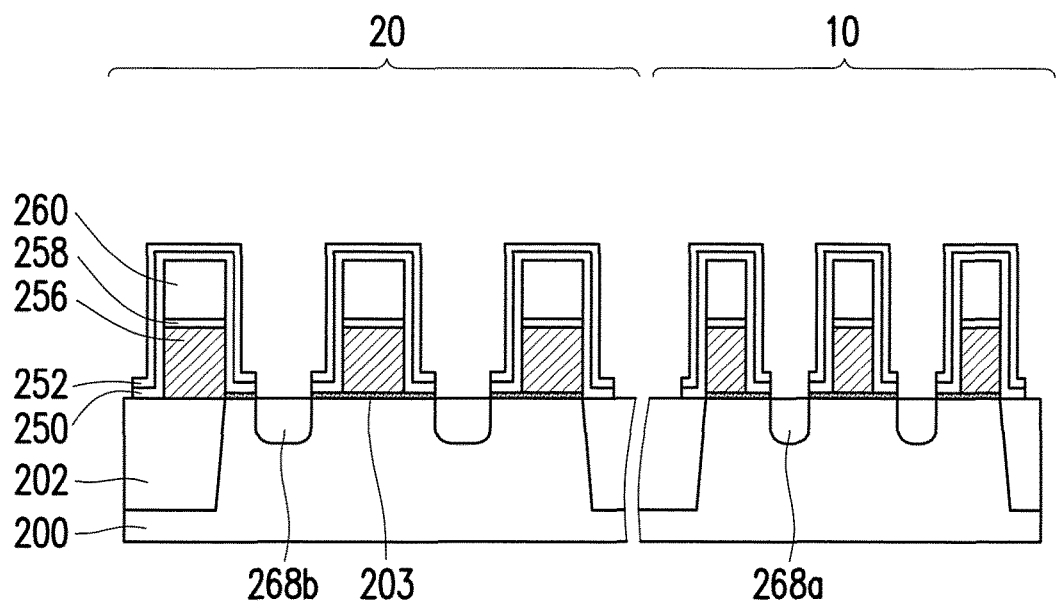

Referring to FIG. 4C, an etching process is continued for two patterns using the etch mask layer 262, wherein since a plurality of materials needs to be etched, the etchant can be changed as needed. The etching process is continued until a recess 268b corresponding to the opening 230 of the second region is formed and a recess 268a corresponding to the opening 230' of the first region 10 is formed in the substrate 200. Moreover, if needed, an implantation step 270 can also be performed on the recessed substrate 100. The implantation step 270 is performed based on actual need, and is not a necessary step. Before the subsequent strained regions are formed, the etch mask layer 262 is, for instance, a photoresist layer and is removed.

Due to the adjustment of the etch mask layer 262 on the opening 230' in the first region 10 and the opening 230 in the second region 20, the distances for the recess 268a and the recess 268b to the adjacent gate layer 256 can be accurately configured.

Referring to FIG. 4D, epitaxial layers 268a and 268b are formed in the recesses 266a and 266b as strained regions. The epitaxial layers 268a and 268b are, for instance, SiGe. The epitaxial layers 268a and 268b are used as the source/drain regions. Lastly, the mask layer 254 is also removed. In the present embodiment, the sealing layer 250 and the hard mask layer 252 are kept as spacers of the gate structures, but the invention is not limited thereto. In other words, the sealing layer 250 and the hard mask layer 252 can also be partially or completely removed.

The invention provides a technique shown in FIG. 2 and the second distance 122 is controlled to be greater than the first distance 110 to achieve the respective demands for the core circuit and the IO circuit. The manufacturing method thereof can be implemented by, for instance, the methods of the embodiments.

Lastly, it should be mentioned that: each of the above embodiments is only used to describe the technical solutions of the invention and is not intended to limit the invention; and although the invention is described in detail via each of the above embodiments, those having ordinary skill in the art should understand that: modifications can still be made to the technical solutions recited in each of the above embodiments, or portions or all of the technical features thereof can be replaced to achieve the same or similar results; the modifications or replacements do not make the nature of corresponding technical solutions depart from the scope of the technical solutions of each of the embodiments of the invention.

What is claimed is:

1. A semiconductor device manufacturing method, wherein a substrate has a first region and a second region, comprising:

forming a plurality of first gate structures in the first region on the substrate and a plurality of second gate structures in the second region on the substrate;

forming a mask layer on the plurality of first gate structures and the plurality of second gate structures, wherein the mask layer has an uppermost surface higher than uppermost surfaces of the plurality of first gate structures and the plurality of second gate structures;

planarizing the mask layer to obtain a flat surface;

forming an etch mask layer on the flat surface of the mask layer, wherein the etch mask layer has a plurality of first mask regions covering the plurality of first gate structures and extended by a first distance and a plurality of second mask regions covering the plurality of second gate structures and extended by a second distance, wherein the second distance is substantially greater than the first distance;

performing an etching process according to the etch mask layer to expose a plurality of surface regions of the substrate;

forming a plurality of strained regions in the plurality of surface regions in the substrate; and removing the mask layer.

2. The semiconductor device manufacturing method of claim 1, wherein the step of forming the plurality of strained regions comprises:

etching the substrate in the plurality of surface regions to form a plurality of recesses in the substrate;

removing the etch mask layer; and forming an epitaxial layer in the plurality of recesses.

3. The semiconductor device manufacturing method of claim 2, wherein a material of the epitaxial layer is SiGe.

4. The semiconductor device manufacturing method of claim 1, wherein the second distance is at least 1.5 times the first distance.

5. The semiconductor device manufacturing method of claim 1, wherein the first strained region and the second strained region are used to form source/drain regions with respect to the plurality of first gate structures and the plurality of second gate structures.

6. The semiconductor device manufacturing method of claim 1, wherein the first region is a core device region and the second region is an I/O device region.

7. The semiconductor device manufacturing method of claim 1, wherein a thickness of the mask layer is sufficient to completely fill a space between an adjacent pair in the plurality of first gate structures and the plurality of second gate structures.

8. A semiconductor device manufacturing method, wherein a substrate has a first region and a second region, comprising:

forming a plurality of first gate structures in the first region on the substrate and a plurality of second gate structures in the second region on the substrate;

forming a mask layer on the plurality of first gate structures and the plurality of second gate structures, wherein the mask layer is kept conformal to the plurality of first gate structures and the plurality of second gate structures;

forming an etch mask layer on the mask layer to cover the plurality of second gate structures and extended by a distance, wherein the etch mask layer does not cover the plurality of first gate structures;

performing an etching process using the etch mask layer to expose a plurality of surface regions of the substrate;

forming a plurality of strained regions in the plurality of surface regions in the substrate; and removing the mask layer, wherein the plurality of strained regions are used to form source/drain regions with respect to the plurality of first gate structures and the plurality of second gate structures.

9. The semiconductor device manufacturing method of claim 8, wherein the step of forming the plurality of strained regions comprises:

etching the substrate in the plurality of surface regions to form a plurality of recesses in the substrate;

removing the etch mask layer; and forming an epitaxial layer in the plurality of recesses.

10. The semiconductor device manufacturing method of claim 9, wherein a material of the epitaxial layer is SiGe.

11. The semiconductor device manufacturing method of claim 8, wherein a second distance from the strained regions to a directly adjacent second gate structure is at least 1.5 times a first distance from the strained regions to a directly adjacent first gate structure, wherein the second distance and the first distance are measured along a direction parallel with a top surface of the substrate.

12. The semiconductor device manufacturing method of claim 8, wherein the first region is a core device region and the second region is an I/O device region.

13. The semiconductor device manufacturing method of claim 8, wherein a thickness of the mask layer is within a range and conformal to the plurality of first gate structures and the plurality of second gate structures.

\* \* \* \* \*